(12) United States Patent
Inoue et al.

(10) Patent No.: US 11,235,744 B2
(45) Date of Patent: Feb. 1, 2022

(54) HYDRAULIC PRESSURE CONTROL DEVICE

(71) Applicant: ADVICS CO., LTD., Kariya (JP)

(72) Inventors: Atsushi Inoue, Kariya (JP); Tsuyoshi Otake, Obu (JP)

(73) Assignee: ADVICS CO., LTD., Kariya (JP)

( * ) Notice: Subject to any disclaimer, the term of this patent is extended or adjusted under 35 U.S.C. 154(b) by 91 days.

(21) Appl. No.: 16/631,291

(22) PCT Filed: Jul. 18, 2018

(86) PCT No.: PCT/JP2018/026957
§ 371 (c)(1),
(2) Date: Jan. 15, 2020

(87) PCT Pub. No.: WO2019/017400
PCT Pub. Date: Jan. 24, 2019

(65) Prior Publication Data
US 2020/0207316 A1    Jul. 2, 2020

(30) Foreign Application Priority Data

Jul. 18, 2017  (JP) .............................. JP2017-138745

(51) Int. Cl.
*B60T 8/34*   (2006.01)
*B60T 13/68*  (2006.01)
(Continued)

(52) U.S. Cl.
CPC .............. *B60T 8/34* (2013.01); *B60T 13/686* (2013.01); *B60T 13/662* (2013.01); *B60T 17/02* (2013.01); *B60Y 2400/81* (2013.01)

(58) Field of Classification Search
CPC .......... B60T 8/34; B60T 17/02; B60T 13/686; B60T 13/662; H02K 7/106; H02K 11/00; H02K 11/02; H02K 23/66; B60Y 2400/81
See application file for complete search history.

(56) References Cited

U.S. PATENT DOCUMENTS 6,810,316 B2 * 10/2004 Yokoyama ............ B60T 13/741
                                                        188/156
9,788,465 B2 * 10/2017 Haas .................... H02K 11/026
(Continued)

FOREIGN PATENT DOCUMENTS

JP       10302920 A  * 11/1998
JP   2003137081 A      5/2003
(Continued)

OTHER PUBLICATIONS

International Search Report (PCT/ISA/210) and translation and Written Opinion (PCT/ISA/237) dated Sep. 18, 2018, by the Japanese Patent Office as the International Searching Authority for International Application No. PCT/JP2018/026957.

*Primary Examiner* — Pamela Rodriguez
(74) *Attorney, Agent, or Firm* — Buchanan Ingersoll & Rooney PC

(57) ABSTRACT

This hydraulic pressure control device is provided with: a housing having a motor mounted to a surface on one side thereof and which has an oil passage formed thereinside; a case which is mounted to a surface on the other side of the housing and has a circuit board disposed thereinside; a sensor which detects a signal of the motor; a signal wire which connects between the sensor and the circuit board; and a power wire through which electric power is supplied to the motor, wherein the signal wire and the power wire are disposed inside a single through-hole that is formed in the housing so as to penetrate from the surface on the one side to the surface on the other side, and the signal wire or the power wire within the through-hole is covered with a shielding member that blocks out power supply noise generated during power supply.

7 Claims, 3 Drawing Sheets

(51) Int. Cl.
    *B60T 13/66*     (2006.01)
    *B60T 17/02*     (2006.01)

(56) References Cited

U.S. PATENT DOCUMENTS

2003/0083797 A1    5/2003    Yokoyama et al.
2020/0067381 A1\*  2/2020    Suzuki .................. H02K 3/522

FOREIGN PATENT DOCUMENTS

JP        2006076507 A        3/2006
JP        2009146704 A  \*  7/2009

\* cited by examiner

HYDRAULIC PRESSURE CONTROL DEVICE

TECHNICAL FIELD

The disclosure relates to a hydraulic pressure control device provided with a brushless motor.

BACKGROUND ART

A hydraulic pressure control device includes a brushless motor, a housing having an oil passage formed therein, a power wire for supplying electric power to the brushless motor, and a signal wire for transmitting a signal from a rotation angle sensor that detects a rotation angle of the brushless motor, for example. For example, in a hydraulic pressure control device disclosed in JP-A-2006-76507, a signal wire and a power wire are arranged at positions separated from each other in a housing, so that power supply noise generated by supplying electric power to the power wire is suppressed from getting on the signal wire.

CITATION LIST

Patent Literature

PTL 1: JP-A-2006-76507

SUMMARY OF INVENTION

Technical Problem

However, in the hydraulic pressure control device, the skeleton tends to be large because a plurality of holes (wiring arrangement holes) must be formed in the housing. Further, in the hydraulic pressure control device, the design of oil passages and connection lines tends to be complicated since cutting increases, and there is a problem in terms of the freedom of degree in arranging the oil passages. That is, the hydraulic pressure control device has room for improvement in terms of the downsizing and the degree of freedom in arranging the oil passages.

The disclosure has been made in view of such circumstances, and an object thereof is to provide a hydraulic pressure control device capable of reducing the size and improving the degree of freedom in arranging the oil passages while suppressing the influence of power supply noise on the signal wire.

Solution to Problem

A hydraulic pressure control device according to a first aspect of the disclosure includes a brushless motor; a housing having a surface on one side to which the brushless motor is attached and having an oil passage formed therein; a case attached to a surface on the other side of the housing and having a circuit board disposed therein; a sensor configured to detect a signal of the brushless motor; a signal wire configured to connect the sensor and the circuit board; and a power wire configured to supply electric power to the brushless motor. The signal wire and the power wire are disposed in a single through-hole provided in the housing so as to penetrate from the surface on one side to the surface on the other side. The signal wire or the power wire within the through-hole is covered with a shielding member that blocks out power supply noise generated during power supply.

Further, a hydraulic pressure control device according to a second aspect of the disclosure includes a brushless motor; a housing having a surface on one side to which the brushless motor is attached and having an oil passage formed therein; a case attached to a surface on the other side of the housing and having a circuit board disposed therein; a sensor configured to detect a signal of the brushless motor; a signal wire configured to connect the sensor and the circuit board; and a power wire configured to supply electric power to the brushless motor. The signal wire and the power wire are disposed in a single through-hole provided in the housing so as to penetrate from the surface on one side to the surface on the other side. A restricting portion configured to restrict the arrangement position of the signal wire within a predetermined possible arrangement range is provided in the through-hole. The power wire is configured as a set of three wirings that constitute a symmetrical three-phase alternating current and are out of phase with each other. The three wirings are arranged in the through-hole at equal intervals on a virtual cylinder which is parallel to the direction in which the through-hole extends, and which has a straight line located within the possible arrangement range as a central axis.

Advantageous Effects of Invention

According to the disclosure, since the signal wire and the power wire are disposed in the single through-hole, there is no need to form a plurality of holes in the housing, and it is possible to reduce the size and improve the degree of freedom in arranging the oil passage. Further, according to the first aspect of the disclosure, since the signal wire or the power wire is covered with the shielding member, the influence of power supply noise is suppressed. Further, according to the second aspect of the disclosure, since the signal wire is disposed at a position where the influences of the magnetic fields by the wirings of the power wire cancel each other, the influence of power supply noise is suppressed.

DESCRIPTION OF EMBODIMENTS

Hereinafter, embodiments of the disclosure will be described with reference to the drawings. Meanwhile, each drawing used for explanation is a conceptual diagram, and the shape of each part may not necessarily be exact.

First Embodiment

Figure 1:
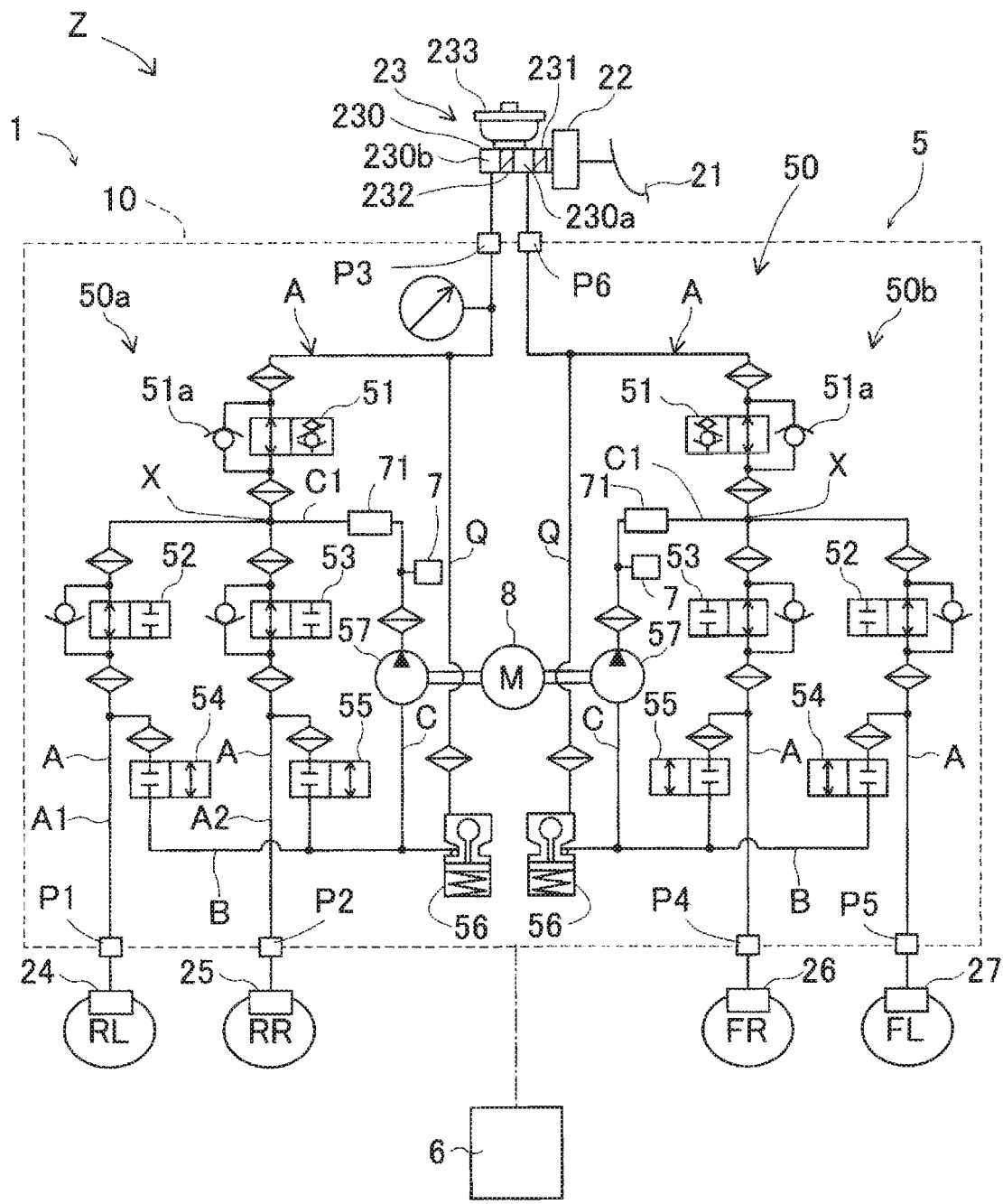
FIG. 1 is a configuration view of a brake device according to a first embodiment.
Figure 2:
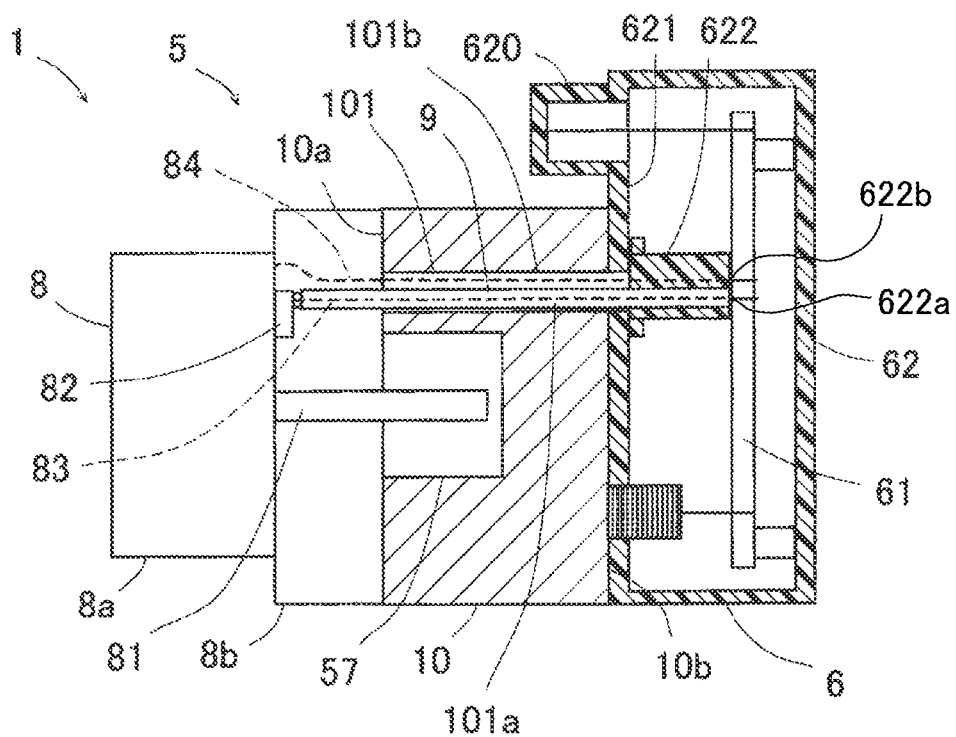
FIG. 2 is a partial sectional view of a hydraulic pressure control device according to the first embodiment.

As shown in FIGS. 1 and 2, a hydraulic pressure control device 1 according to a first embodiment includes an actuator 5, a brake ECU 6, and a shielding plate (corresponding to the "shielding member") 9. The shielding plate 9 will be described later. The actuator 5 is incorporated in a brake device Z of a vehicle. First, the entire brake device Z including the actuator 5 will be briefly described. A cylinder mechanism 23 includes a master cylinder 230, master pistons 231, 232, and a master reservoir 233. The master pistons 231, 232 are slidably disposed in the master cylinder 230. The master pistons 231, 232 partition the inside of the master cylinder 230 into a first master chamber 230a and a second master chamber 230b. The master reservoir 233 is a reservoir tank having a flow passage communicating with the first master chamber 230a and the second master chamber 230b. The master reservoir 233 and each of the master chambers 230a, 230b are communicated and blocked by the movement of the master pistons 231, 232.

A wheel cylinder 24 is disposed in a wheel RL (rear left wheel). A wheel cylinder 25 is disposed in a wheel RR (rear right wheel). A wheel cylinder 26 is disposed in a wheel FL (front left wheel). A wheel cylinder 27 is disposed in a wheel FR (front right wheel). The master cylinder 230 and the wheel cylinders 24 to 27 are connected via the actuator 5. The wheel cylinders 24 to 27 drive a friction brake (not shown) including a brake pad or the like to apply a braking force to the wheels RL to FR.

Thus, when a driver steps on a brake operation member 21, the stepping force is boosted by a booster 22 and the master pistons 231, 232 in the master cylinder 230 are pressed. As a result, the same master cylinder pressure (hereinafter, referred to as master pressure) is generated in the first master chamber 230a and the second master chamber 230b. The master pressure is transmitted to the wheel cylinders 24 to 27 via the actuator 5.

The actuator 5 is a device that adjusts the hydraulic pressure (hereinafter, referred to as wheel pressure) of the wheel cylinders 24 to 27 in accordance with an instruction from the brake ECU 6 as a control unit. Specifically, as shown in FIG. 1, the actuator 5 includes a housing 10, a hydraulic circuit 50, a damper 7, a motor 8, and a check valve 71. The housing 10 is a rectangular parallelepiped metal block and has a flow passage (oil passage) and an accommodation portion for various components formed therein by cutting or the like. The housing 10 has a plurality of side surfaces. In addition to the oil passage (hydraulic circuit 50), a through-hole 101 is formed in the housing 10. The through-hole 101 will be described later.

The hydraulic circuit 50 is disposed and formed in the housing 10 and includes a first piping system 50a and a second piping system 50b. The first piping system 50a is a system that controls the hydraulic pressure (wheel pressure) applied to the wheels RL, RR. The second piping system 50b is a system that controls the hydraulic pressure (wheel pressure) applied to the wheels FL, FR. Since the basic configurations of the first piping system 50a and the second piping system 50b are the same, the first piping system 50a will be described below, and the description for the second piping system 50b will be omitted.

The first piping system 50a includes a main flow passage A, a differential pressure control valve 51, pressure increasing valves 52, 53, a pressure reducing flow passage B, pressure reducing valves 54, 55, a pressure regulation reservoir 56, a reflux flow passage C, a pump 57, an auxiliary flow passage Q, WC ports (wheel cylinder ports) P1, P2, an MC port (master cylinder port) P3. The WC port P1 is a port connected to the wheel cylinder 24, and the WC port P2 is a port connected to the wheel cylinder 25. The MC port P3 is a port connected to the master cylinder 230. Meanwhile, similarly to the first piping system 50a, the second piping system 50b is provided with WC ports P4, P5 and an MC port P6.

The main flow passage A is a part of a flow passage connecting the master cylinder 230 and the wheel cylinders 24, 25, which is formed in the housing 10. That is, the main flow passage A is a flow passage that connects the WC ports P1, P2 and the MC port P5. The differential pressure control valve 51 is an electromagnetic valve that is disposed at a portion of the main flow passage A located between a connection portion X (to be described later) and the MC port P3. The differential pressure control valve 51 is a valve that controls the main flow passage A between a communication state (no throttle state) and a differential pressure state (throttle state). Specifically, the differential pressure control valve 51 is an electromagnetic valve that is configured to be able to control differential pressure between hydraulic pressure of a portion of the main flow passage A closer to the master cylinder 230 than itself and hydraulic pressure of a portion of the main flow passage A closer to the wheel cylinders 24, 25 than itself. In other words, the differential pressure control valve 51 controls the differential pressure between its own upstream side and downstream side in accordance with an instruction from the brake ECU 6. The differential pressure control valve 51 is in the communication state in a non-energized state. The differential pressure control valve 51 is controlled in the communication state in a normal brake control excluding pressurization control (pressure increase assist), automatic braking, and skid prevention control or the like. The differential pressure control valve 51 is set so that the differential pressure on both sides increases as the applied control current increases.

A check valve 51a is provided for the differential pressure control valve 51. The main flow passage A is branched into two flow passages A1, A2 at the connection portion X located on the downstream side of the differential pressure control valve 51 so as to correspond to the wheel cylinders 24, 25. The connection portion X can be said to be a portion on the downstream side of the differential pressure control valve 51 where the main flow passage A is branched.

The pressure increasing valves 52, 53 are electromagnetic valves that are opened and closed in accordance with an instruction from the brake ECU 6. The pressure increasing valves 52, 53 are normally opened valves that are in an opened state (communication state) in the non-energized state. The pressure increasing valve 52 is disposed in the flow passage A1, and the pressure increasing valve 53 is disposed in the flow passage A2. That is, the pressure increasing valves 52, 53 are electromagnetic valves that are disposed in portions of the main flow passage A located between the connection portion X and the WC ports P1, P2. The pressure increasing valves 52, 53 are energized and closed mainly during the pressure reduction control, so that the master cylinder 230 and the wheel cylinders 24, 25 are blocked. The pressure reducing flow passage B is a flow passage that connects the WC ports P1, P2 and the pressure regulation reservoir 56. The pressure reducing flow passage B connects the portion of the flow passage A1 located between the pressure increasing valve 52 and the wheel cylinder 24 and the pressure regulation reservoir 56, and connects the portion of the flow passage A2 located between the pressure increasing valve 53 and the wheel cylinder 25 and the pressure regulation reservoir 56. The pressure reducing flow passage B uses a part of the main flow passage A.

The pressure reducing valves 54, 55 are electromagnetic valves that are opened and closed in accordance with an instruction from the brake ECU 6. The pressure reducing valves 54, 55 are normally closed valves that are in a closed state (blocked state) in the non-energized state. The pressure reducing valve 54 is disposed in the pressure reducing flow passage B on the side of the wheel cylinder 24. The wheel cylinder 24 and the pressure regulation reservoir 56 are communicated and blocked according to the opening and closing of the pressure reducing valve 54. The pressure reducing valve 55 is disposed in the pressure reducing flow passage B on the side of the wheel cylinder 25. The wheel cylinder 25 and the pressure regulation reservoir 56 are communicated and blocked according to the opening and closing of the pressure reducing valve 55. The pressure reducing valves 54, 55 are energized and opened mainly during the pressure reduction control, so that the wheel cylinders 24, 25 and the pressure regulation reservoir 56 are communicated via the pressure reducing flow passage B. The pressure regulation reservoir 56 is a reservoir including a cylinder, a piston and an urging member.

The reflux flow passage C is a flow passage that connects the pressure reducing flow passage B (or the pressure regulation reservoir 56) and the connection portion X. The connection portion X is a portion of the main flow passage A located between the differential pressure control valve 51 and the pressure increasing valves 52, 53. The connection portion X is a connection portion between the main flow passage A and the reflux flow passage C. The connection portion X can be said to be a portion (region) of the main flow passage A located between the differential pressure control valve 51 and the pressure increasing valve 52. Meanwhile, in terms of circuit expression, on the hydraulic pressure circuit diagram (FIG. 1), at the connection portion X represented by a point, the main flow passage A is branched and the main flow passage A and a discharge flow passage C1 are connected.

The pump 57 is provided in the reflux flow passage C. The pump 57 is a piston pump driven by the motor 8. The pump 57 causes the brake fluid to flow from the pressure regulation reservoir 56 to the master cylinder 230 or the wheel cylinders 24, 25 via the reflux flow passage C. The reflux flow passage C includes the discharge flow passage C1 that connects a discharge valve 57a of the pump 57 and the connection portion X on the main flow passage A. The discharge flow passage C1 is a flow passage of the reflux flow passage C on the upstream side of the pump 57. The motor 8 is energized and driven via a relay (not shown) in accordance with an instruction from the brake ECU 6. The motor 8 can be said to be a pump driving means. The motor 8 will be described later. The check valve 71 is disposed in the discharge flow passage C1. The check valve 71 allows the brake fluid to flow from the pump 57 to the main flow passage A and prohibits the brake fluid from flowing from the main flow passage A to the pump 57. The auxiliary flow passage Q is a flow passage that connects the pressure regulation reservoir 56 and the portion of the main flow passage A on the upstream side (or the master cylinder 230) of the differential pressure control valve 51.

With the driving of the pump 57, the brake fluid in the master cylinder 230 is discharged to the connection portion X via the auxiliary flow passage Q and the pressure regulation reservoir 56 and the like. As a result, for example, during vehicle motion control such as automatic braking or skid prevention control, the target wheel pressure is increased. The actuator 5 in the first embodiment functions as an anti-lock braking system (ABS) or a skid prevention device (ESC) under the control of the brake ECU 6. The brake ECU 6 is an electronic control unit including a CPU, a memory, and the like. The brake ECU 6 is connected to the actuator 5 and controls the motor 8 (the pump 57) and a plurality of electromagnetic valves 51 to 55.

In this way, the actuator 5 includes the housing 10, the pump 57 disposed in the housing 10, the motor 8 for driving the pump 57, a plurality of electromagnetic valves 51 to 55 disposed in the housing 10, the WC ports P1, P2 (P4, P5) provided in the housing 10 and connected to the wheel cylinders 24, 25 (26, 27), the flow passages A to C provided in the housing 10 and connecting the pump 57 and the plurality of electromagnetic valves 51 to 55 and the WC ports P1, P2 (P4, P5), the MC port P3 (P6) provided in the housing 10 and connected to the master cylinder 230, and the pressure regulation reservoir 56 disposed in the housing 10. The motor 8 and the plurality of electromagnetic valves 51 to 55 are controlled by the brake ECU 6 to generate hydraulic pressure in the wheel cylinders 24, 25 (26, 27).

(Motor and Brake ECU)

Here, the motor 8 and the brake ECU 6 will be further described. The motor 8 is a brushless motor. As shown in FIG. 2, the motor 8 is attached to a surface 10a on one side of the housing 10. Specifically, the motor 8 includes a motor body part 8a, a frame 8b configured integrally with the motor body part 8a, and an output shaft 81. Meanwhile, FIG. 2 is a conceptual diagram in which the internal configurations of the motor 8, the housing 10, and the brake ECU 6 are partially omitted. Further, in FIG. 2, in the notation of the drawing, a signal wire 83 and a power wire 84 are indicated by broken lines.

The motor body part 8a includes a rotor, a stator, a winding, a cover, and the like (not shown). The frame 8b is a case part disposed on the side of the housing 10 of the motor body part 8a. The motor body part 8a is fixed to the housing 10 via a fixing means of the frame 8b. The output shaft 81 protrudes from the motor body part 8a and is connected to the pump 57 disposed in the housing 10 to drive the pump 57.

The motor 8 is provided with a rotation angle sensor 82 that detects a rotation angle of the motor 8. The rotation angle sensor 82 is disposed in the frame 8b. A plurality of signal wires 83 for transmitting signals (detection results) to the brake ECU 6 is connected to the rotation angle sensor 82. Further, a plurality of power wires 84 for supplying electric power is connected to the motor 8. The power wires 84 are configured as a set of three wirings that constitute a symmetrical three-phase alternating current and are out of phase with each other. At least one set of power wires 84 is connected to the motor 8. Meanwhile, a plurality of power wires for supplying electric power is also connected to the rotation angle sensor 82. However, for the sake of explanation, the power wire of the rotation angle sensor 82 is also one of the signal wires 83. For example, four signal wires 83 connected to the rotation angle sensor 82 are composed of two wirings for transmitting detection results and two wirings for supplying electric power. Further, the current supplied to the rotation angle sensor 82 is small (e.g., mA order), and its influence can be ignored. Further, although not shown, each wiring is covered with an insulator. Further, a plurality of wirings may be combined into one. In FIG. 2, the detailed sectional configuration of the wiring is omitted.

The brake ECU 6 includes a circuit board 61 on which elements are disposed, and a case 62 in which the circuit board 61 is disposed. The circuit board 61 constitutes an ECU. The circuit board 61 controls the electromagnetic valve in the housing 10 and supplies electric power. The case 62 is a rectangular parallelepiped hollow member as a whole and is attached to a surface 10b on the other side of the housing 10. A part of the electromagnetic valve for controlling the hydraulic pressure of the oil passage (50) of the housing 10 described above is disposed in the case 62. The surface 10b on the other side is a surface opposite to the surface 10a on one side of the housing 10, that is, a surface back to back with the surface 10a on one side. Further, a connector portion 620 for connecting an external device and the brake ECU 6 is formed in the case 62.

In this way, the hydraulic pressure control device of the first embodiment includes the housing 10 having the surface 10a on one side to which the motor 8 is attached and having the oil passage (50) formed therein, the case 62 attached to the surface 10b on the other side of the housing 10 and having the circuit board 61 disposed therein, the rotation angle sensor 82 for detecting a signal (rotation angle information) of the motor 8, the signal wires 83 for connecting the rotation angle sensor 82 and the circuit board 61, and the power wires for supplying electric power to the motor 8. In the following description, the axial direction of the output shaft 81 is simply referred to as the "axial direction." The surface 10a on one side is a surface on one side in the axial direction among a plurality of side surfaces of the housing 10, and the surface 10b on the other side is a surface on the other side in the axial direction among a plurality of side surfaces of the housing 10. Further, the through-hole 101 extends in the axial direction.

(Noise Suppression and Downsizing Configuration)

Figure 3:
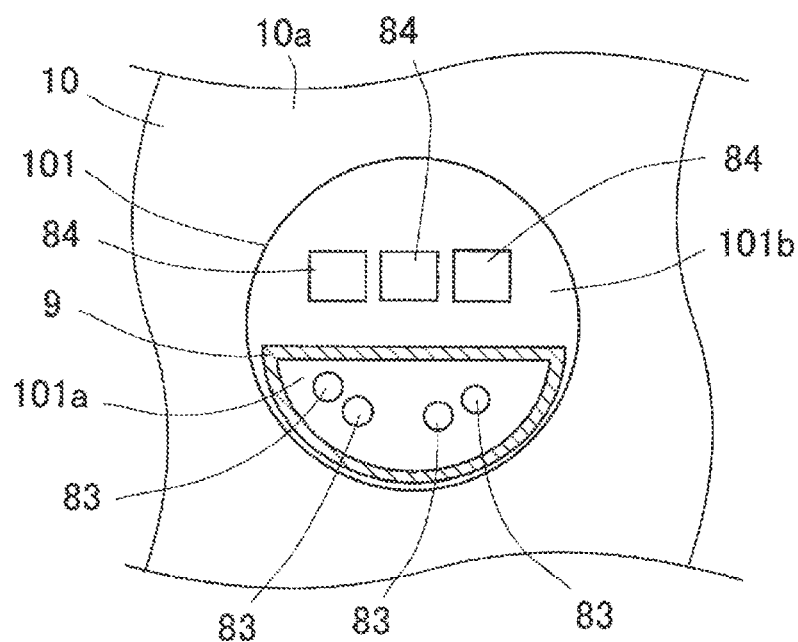
FIG. 3 is a sectional view of a shielding plate taken along a surface on one side of a housing in the first embodiment.

The signal wires 83 and the power wires 84 are disposed in one through-hole 101 provided in the housing 10 so as to penetrate from the surface 10a on one side to the surface 10b on the other side. That is, the signal wires 83 and the power wires 84 are disposed in the same (common) through-hole 101. As shown in FIGS. 2 and 3, at least in the through-hole 101, the signal wires 83 are covered with the shielding plate 9 that blocks power supply noise generated during power supply. In other words, the shielding plate 9 surrounding the signal wires 83 is disposed in the through-hole 101. The shielding plate 9 is formed in a cylindrical shape by a plate-like conductive material. The cylindrical shielding plate 9 extends in the axial direction. The shielding plate 9 partitions the inside of the through-hole 101 into a first chamber 101a and a second chamber 101b. In the through-hole 101, the first chamber 101a is a region surrounded by the shielding plate 9, and the second chamber 101b is the other region. The shielding plate 9 in the first embodiment is formed in a semicircular sectional shape according to the shape of the through-hole 101.

One end in the axial direction of the shielding plate 9 protrudes from the surface 10a on one side of the housing 10 and is disposed in the frame 8b of the motor 8. The frame 8b is configured such that the one end in the axial direction of the shielding plate 9 can be placed from the outside to the inside. For example, the frame 8b has a hollow portion or a hole. The signal wires 83 extend from an opening at the one end in the axial direction of the shielding plate 9 toward the rotation angle sensor 82. The signal wires 83 are connected to the connector portion of the rotation angle sensor 82. The power wires 84 extend from the opening at the one end in the axial direction of the shielding plate 9 toward the winding of the motor body part 8a so as to be separated from the signal wires 83.

The other end in the axial direction of the shielding plate 9 protrudes from the surface 10b on the other side of the housing 10 and is disposed in the case 62. The other end in the axial direction of the shielding plate 9 is disposed in a connector 622 formed integrally with a wall surface 621 of the case 62 on the side of the housing 10. In the first embodiment, the shielding plate 9 and the resin case 62 (including the connector 622) are formed by integral molding (here, insert molding). A first terminal group 622a (and/or the ends of the signal wires 83) surrounded by the shielding plate 9 and a second terminal group 622b (and/or the ends of the power wires 84) as other terminal groups are provided in the connector 622. Each terminal of the first terminal group 622a is a conductive member having one end connected to the corresponding signal wire 83 and the other end connected to the corresponding portion of the circuit board 61. Each terminal of the second terminal group 622b is a conductive member having one end connected to the corresponding power wire 84 and the other end connected to the corresponding portion of the circuit board 61.

In an example of the method of manufacturing the hydraulic pressure control device 1 according to the first embodiment, first, the case 62 including the connector 622 and the shielding plate 9 are integrally molded by insert molding. At this time, the signal wires 83 (and/or the first terminal group 622a) and the power wires 84 (and/or the second terminal group 622b) are also insert-molded in the case 62. In this way, an integrally molded product is formed in which the signal wires 83 are disposed inside the cylindrical shielding plate 9 (in the first chamber 101a) protruding from the case 62 and the signal wires 83 and the power wires 84 are connected to the connector 622. At least the case 62 and the shielding plate 9 are formed as a single integrally molded product in which the shielding plate 9 is configured to be able to cover the signal wires 83. Then, the shielding plate 9 is inserted into the through-hole 101 of the housing 10 together with the signal wires 83 and the power wires 84, and the case 62 is attached to the housing 10. Then, the signal wires 83 are connected to the rotation angle sensor 82, the power wires 84 are connected to predetermined portions of the motor 8, and one end of the shielding plate 9 is placed in the motor 8 (the frame 8b). Then, the motor 8 is attached to the housing 10.

According to the first embodiment, since the signal wires and the power wires 84 are disposed in the single through-hole 101 of the housing 10, there is no need to form a plurality of holes in the housing 10, and it is possible to reduce the size and improve the degree of freedom in arranging the oil passage. Further, since the signal wires 83 are covered with the shielding plate 9, the influence of power supply noise can be suppressed. According to the first embodiment, while suppressing the influence of power supply noise, the number of the through-holes required in the housing 10 can be minimized, the degree of freedom of the oil passage layout can be maximized, and the size of the skeleton can be reduced.

Further, in the first embodiment, since the shielding plate 9 is employed as the shielding member, it is easy to form a shielding shape (here, a cylindrical shape) for covering the signal wires 83, or it is possible to adjust the shielding degree by changing the plate thickness. As a result, the manufacturing becomes easy. Further, the shielding plate 9 can be easily molded integrally with other members such as the case 62 or the frame 8b of the motor 8. In the first embodiment, since an integrally molded product in which the case 62 and the shielding plate 9 are integrally molded is obtained, reduction in assembly man-hours, improvement in assembly performance, or improvement in vibration resistance becomes possible. For example, when the shielding plate 9 and other members (e.g., the case 62, the frame 8b, or a bus bar of the circuit board 61) are integrally arranged by integral molding, fitting, or adhesion or the like, the assembly performance and vibration resistance can be improved.

Further, since the shielding plate 9 is formed to cover the signal wires 83, the shielding plate 9 (shielding area) can be made smaller, compared to a configuration in which the shielding plate 9 is formed to cover the power wires 84. The current passing through the power wire 84 is approximately 1000 times larger than the current passing through the signal wire 83, and the wiring of the power wire 84 is also thicker (the sectional area is larger) than that of the signal wire 83. When the shielding plate 9 is made smaller, the size of the through-hole 101 can be also reduced, and further downsizing and improvement in the layout degree of freedom are possible.

Further, the rotation angle sensor 82 is the connection destination of the signal wire 83, and its detection requires higher accuracy than other sensors such as a temperature sensor, for example. Therefore, by adopting the configuration as in the first embodiment, noise is suppressed and high detection accuracy can be maintained.

Second Embodiment

Figure 4:
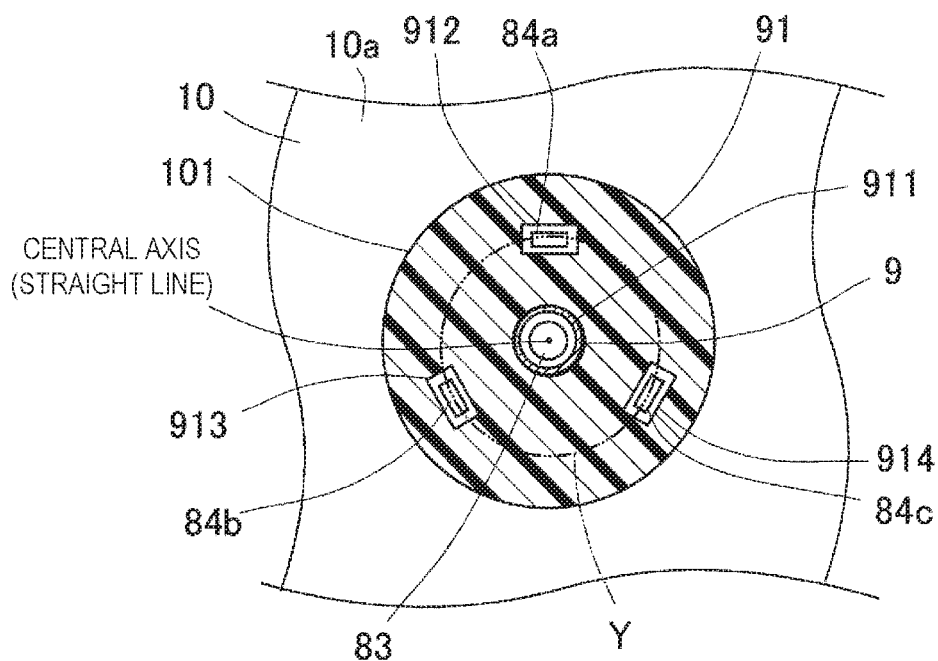
FIG. 4 is a sectional view of a shielding plate taken along a surface on one side of a housing in a second embodiment.

A hydraulic pressure control device of a second embodiment is different from that of the first embodiment mainly in the arrangement of the wirings in the through-hole 101. Therefore, different parts will be described, and other description will be omitted. In the description of the second embodiment, reference can be made to the description and drawings of the first embodiment. FIG. 4 is a partial sectional view of a member in the through-hole 101 taken along the surface 10a on one side of the housing 10 (taken along a plane orthogonal to the axial direction). Meanwhile, in FIG. 4, the detailed sectional configuration of the wiring is omitted, and the signal wires 83 are collectively shown as one wiring.

As shown in FIG. 4, in the second embodiment, a restricting portion 91 for restricting the arrangement positions of the signal wire 83 and the power wire 84 within a predetermined possible arrangement range is provided in the through-hole 101. Specifically, the restricting portion 91 is a resin cylindrical member having a plurality of holes 911 to 914. Diameter of the restricting portion 91 is slightly smaller than that of the through-hole 101.

The holes 911 to 914 penetrate the restricting portion 91 in the axial direction. The hole 911 is a hole in which the signal wire 83 is disposed. The hole 911 is located in a central portion (region including a central axis) of the restricting portion 91 (the through-hole 101). The possible arrangement range of the signal wire 83 falls within the hole 911. That is, the hole 911 (the restricting portion 91) defines the possible arrangement range of the signal wire 83. The hole 911 can be said to be a signal wire arrangement hole.

The other three holes 912 to 914 are holes in which the power wires 84 are respectively arranged. The other three holes 912 to 914 are arranged at equal intervals on a virtual cylinder Y with the central axis of the restricting portion 91 as the central axis. The virtual cylinder Y is parallel to the direction in which the through-hole 101 extends, and has, as a central axis, a straight line (here, the central axis of the restricting portion 91) positioned within the possible arrangement range of the signal wire 83 restricted by the restricting portion 91. In other words, the central axis of the virtual cylinder Y is located in a region (i.e., in the hole 911) where the signal wire 83 restricted by the restricting portion 91 can be arranged. The "straight line located in the possible arrangement range of the signal wire 83" can be said to be the "straight line located on the signal wire 83 or in the movable range of the signal wire 83." The holes 912 to 914 are formed such that the central portions of the holes 912 to 914 are spaced by 120° on the virtual cylinder Y.

Similarly to the first embodiment, the power wires 84 are configured as a set of three wirings 84a, 84b, 84c that constitute a symmetrical three-phase alternating current and are out of phase (U phase, V phase, W phase) with each other. The wiring 84a is disposed in the hole 912, the wiring 84b is disposed in the hole 913, and the wiring 84c is disposed in the hole 914. That is, the three wirings 84a to 84c are arranged in the through-hole 101 at equal intervals on the virtual cylinder Y which is parallel to the direction in which the through-hole 101 extends, and which has a straight line located within the possible arrangement range of the signal wire 83 as the central axis. Movement of the power wires 84 (the wiring 84a to 84c) is restricted in the holes 912 to 914. The holes 912 to 914 can be said to be power wire arrangement holes. In the section orthogonal to the axial direction, a part of each of the wirings 84a to 84c constitutes a vertex of one equilateral triangle.

The shielding plate 9 is cylindrical and is disposed in the hole 911. The signal wire 83 is disposed inside the cylindrical shielding plate 9. That is, in the through-hole 101, the signal wire 83 is covered with the shielding plate 9. The inside of the hole 911 (the inside of the shielding plate 9) can be said to be the first chamber 101a, and the inside of the holes 912 914 can be said to be the second chamber 101b.

In the second embodiment, the region on the central axis of the virtual cylinder Y and its periphery are regions where magnetic fields generated by the wirings 84a to 84c cancel each other and become smaller. According to the second embodiment, since the signal wire 83 is disposed at a position (region) where the influences of the magnetic fields by the wirings 84a to 84c of the power wire 84 cancel each other, the influence of power supply noise is suppressed. Furthermore, in the second embodiment, since the signal wire 83 is surrounded by the shielding plate 9, the influence of power supply noise is further suppressed. Further, according to the second embodiment, it is sufficient to provide one through-hole in the housing 10, and it is possible to reduce the size and improve the degree of freedom in arranging the oil passage.

Figure 5:
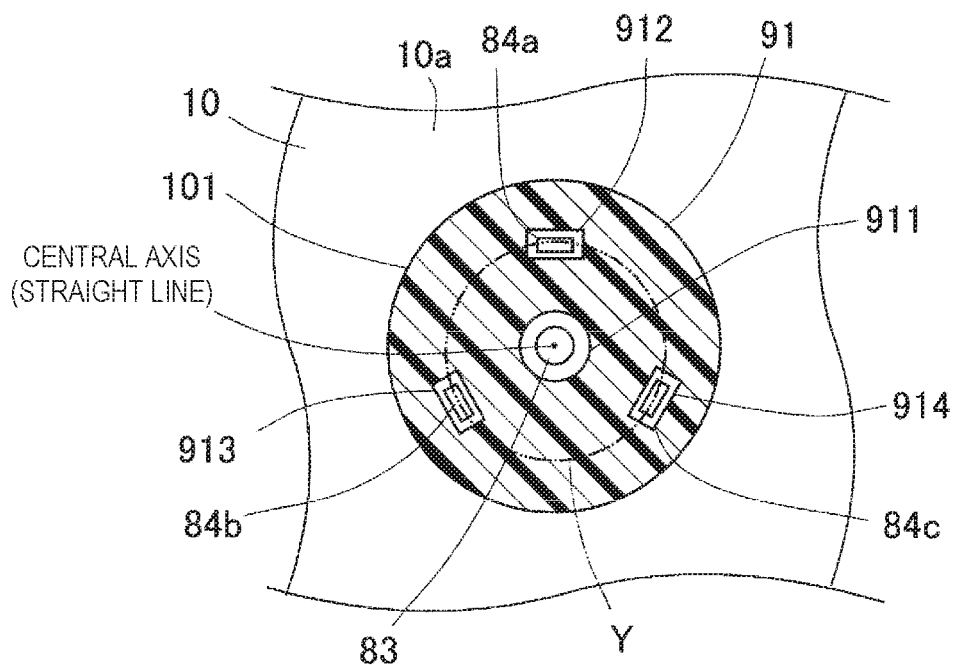
FIG. 5 is a sectional view of a modification of the second embodiment corresponding to FIG. 4.

As a modification of the second embodiment, as shown in FIG. 5, the hydraulic pressure control device 1 may be configured not to include the shielding plate 9. Also by this configuration, the influence of power supply noise can be suppressed due to a decrease in the magnetic field by the cancellation of the magnetic field in the hole 911. In the second embodiment, the central axis of the virtual cylinder Y may be located in the hole 911 (that is, on the signal wire 83 or within the movable range of the signal wire 83). With such wiring arrangement, the influence of power supply noise in the hole 911 is reduced.

<Other>

The disclosure is not limited to the above embodiments. For example, similarly to the case 62, a connector to which the signal wire 83 and/or the power wire 84 is connected may be provided in the frame 8b. The end of the shielding plate 9 may be placed in the connector, and the connector may be integrally molded, fitted or bonded to the frame 8b. Further, the case 62 may not be provided with the connector 622 extending from the circuit board 61 to the wall surface 621. In this case, for example, the opening end of the shielding plate 9 may be exposed to the internal space of the case 62, and the signal wire 83 may extend from the opening end of the shielding plate 9 toward a predetermined portion of the circuit board and extend from the through-hole 101 toward another predetermined portion of the circuit board 61 so as to be away from the signal wire 83. That is, the arrangement configuration of the shielding plate 9 outside the through-hole 101 is not limited to the configuration connected (covered) to the connector 622. Similarly to the side of the frame 8b in the first embodiment, the signal wire 83 and the power wire 84 may be separated.

Further, by using a connector or the like, the position of one end in the axial direction of the shielding plate 9 may be aligned with the surface 10a on one side of the housing 10, and similarly, the position of the other end in the axial direction of the shielding plate 9 may be aligned with the surface 10b on the other side of the housing 10. Further, the connector 622 may be formed separately from the wall surface 621 (the case 62). In this case, for example, the connector 622 may configured to be fitted with a fitting portion provided in the wall surface 621.

Further, a plurality of sets of power wires 84 (with the number of wires that is a multiple of 3) may be provided, and the number of signal wires 83 may be five or more. For example, when a plurality of sets of power wires 84 are provided in the second embodiment, three wirings may be arranged at equal intervals on the same or different virtual cylinders for each set. When the wirings are arranged on the different virtual cylinders for each set, it is preferable that the central axis of each virtual cylinder is the same. Further, the pump 57 may be a pump driven by the motor 8 and may be a gear pump, for example. Further, the shielding member may be a conductive tape or a conductive tube, in addition to the shielding plate 9. Further, the shielding member such as the shielding plate 9 may be configured to cover the power wire 84.

Further, the restricting portion 91 in the second embodiment may be formed to fix (immovably held) the signal wire 83 and/or the power wire 84. For example, the signal wire 83 and the power wire 84 may be arranged at predetermined positions in the through-hole 101, and the inside of through-hole may be filled with resin. Further, in the first embodiment, the through-hole 101 may be filled with resin. Further, the signal wire 83 may be, for example, a wiring of a temperature sensor or a wiring of a communication system.

The invention claimed is:

1. A hydraulic pressure control device, comprising:
a brushless motor;
a housing having a surface on one side to which the brushless motor is attached and having an oil passage formed therein;
a case attached to a surface on the other side of the housing and having a circuit board disposed therein;
a sensor configured to detect a signal of the brushless motor;
a signal wire configured to connect the sensor and the circuit board; and
a power wire configured to supply electric power to the brushless motor,
wherein the signal wire and the power wire are disposed in a single through-hole provided in the housing so as to penetrate from the surface on one side to the surface on the other side,
wherein the signal wire or the power wire within the through-hole is covered with a shielding member that blocks out power supply noise generated during power supply,
wherein the sensor is a rotation angle sensor configured to detect a rotation angle of the brushless motor, and
wherein the shielding member is a shielding plate and is integrally arranged on a frame of the brushless motor, the case, or a bus bar of the circuit board.

2. The hydraulic pressure control device according to claim 1,
wherein a restricting portion configured to restrict the arrangement position of the signal wire within a predetermined possible arrangement range is provided in the through-hole,
wherein the power wire is configured as a set of three wirings that constitute a symmetrical three-phase alternating current and are out of phase with each other, and
wherein the three wirings are arranged in the through-hole at equal intervals on a virtual cylinder which is parallel to the direction in which the through-hole extends, and which has a straight line located within the possible arrangement range as a central axis.

3. A hydraulic pressure control device, comprising:
a brushless motor;
a housing having a surface on one side to which the brushless motor is attached and having an oil passage formed therein;
a case attached to a surface on the other side of the housing and having a circuit board disposed therein;
a sensor configured to detect a signal of the brushless motor;
a signal wire configured to connect the sensor and the circuit board; and
a power wire configured to supply electric power to the brushless motor,
wherein the signal wire and the power wire are disposed in a single through-hole provided in the housing so as to penetrate from the surface on one side to the surface on the other side,
wherein the signal wire or the power wire within the through-hole is covered with a shielding member that blocks out power supply noise generated during power supply,
wherein the shielding member is a shielding plate, and
wherein the shielding member and a frame of the brushless motor, the case, or a bus bar of the circuit board are a single integrally molded product.

4. The hydraulic pressure control device according to claim 3,
wherein a restricting portion configured to restrict the arrangement position of the signal wire within a predetermined possible arrangement range is provided in the through-hole,
wherein the power wire is configured as a set of three wirings that constitute a symmetrical three-phase alternating current and are out of phase with each other, and
wherein the three wirings are arranged in the through-hole at equal intervals on a virtual cylinder which is parallel to the direction in which the through-hole extends, and which has a straight line located within the possible arrangement range as a central axis.

5. A hydraulic pressure control device comprising:
a brushless motor;
a housing having a surface on one side to which the brushless motor is attached and having an oil passage formed therein;
a case attached to a surface on the other side of the housing and having a circuit board disposed therein;
a sensor configured to detect a signal of the brushless motor;
a signal wire configured to connect the sensor and the circuit board; and
a power wire configured to supply electric power to the brushless motor, wherein the signal wire and the power wire are disposed in a single through-hole provided in the housing so as to penetrate from the surface on one side to the surface on the other side, wherein a restricting portion configured to restrict the arrangement position of the signal wire within a predetermined possible arrangement range is provided in the through-hole, wherein the power wire is configured as a set of three wirings that constitute a symmetrical three-phase alternating current and are out of phase with each other, and wherein the three wirings are arranged in the through-hole at equal intervals on a virtual cylinder which is parallel to the direction in which the through-hole extends, and which has a straight line located within the possible arrangement range as a central axis.

6. The hydraulic pressure control device according to claim 5, wherein the signal wire or the power wire within the through-hole is covered with a shielding member that blocks out power supply noise generated during power supply.

7. The hydraulic pressure control device according to claim 6, wherein the shielding member covers the signal wire.

* * * * *